United States Patent
Angelopoulos et al.

(10) Patent No.: US 7,638,266 B2
(45) Date of Patent: Dec. 29, 2009

(54) ULTRATHIN POLYMERIC PHOTOACID GENERATOR LAYER AND METHOD OF FABRICATING AT LEAST ONE OF A DEVICE AND A MASK BY USING SAID LAYER

(75) Inventors: Marie Angelopoulos, Cortlandt Manor, NY (US); Gregory Breyta, San Jose, CA (US); Wu-Song Huang, Poughkeepsie, NY (US); Robert Neal Lang, Pleasant Valley, NY (US); Wenjie Li, Poughkeepsie, NY (US); David R. Medeiros, Ossining, NY (US); Wayne Martin Moreau, Wappingers Falls, NY (US); Karen Elizabeth Petrillo, Voorheesville, NY (US)

(73) Assignee: International Business Machines Corporation, Armonk, NY (US)

( * ) Notice: Subject to any disclaimer, the term of this patent is extended or adjusted under 35 U.S.C. 154(b) by 579 days.

(21) Appl. No.: 10/916,755

(22) Filed: Aug. 12, 2004

(65) Prior Publication Data

US 2006/0035167 A1    Feb. 16, 2006

(51) Int. Cl.
G03F 1/00 (2006.01)
(52) U.S. Cl. .................. 430/322; 430/270.1; 430/311; 430/313; 430/323

(58) Field of Classification Search .............. 430/270.1, 430/322, 921, 311, 313, 323; 257/40
See application file for complete search history.

(56) References Cited

U.S. PATENT DOCUMENTS

| | | | | |
|---|---|---|---|---|
| 6,043,003 | A * | 3/2000 | Bucchignano et al. | 430/326 |
| 6,114,085 | A | 9/2000 | Padmanaban et al. | 430/270.1 |
| 6,261,743 | B1 * | 7/2001 | Pavelchek et al. | 430/325 |
| 6,268,457 | B1 | 7/2001 | Kennedy et al. | 528/39 |
| 6,280,911 | B1 | 8/2001 | Trefonas, III | 430/326 |
| 6,359,125 | B1 | 3/2002 | Kim et al. | 536/23.1 |
| 6,409,328 | B1 | 6/2002 | Ohkawa et al. | 347/100 |
| 7,256,419 | B2 * | 8/2007 | Jeong et al. | 257/40 |

FOREIGN PATENT DOCUMENTS

| | | |
|---|---|---|
| EP | 0 987 600 A1 | 9/1998 |
| EP | 1 061 560 A2 | 6/2000 |
| EP | 1 061 560 A3 | 6/2000 |
| EP | 1 178 354 A1 | 7/2001 |

* cited by examiner

*Primary Examiner*—Thorl Chea
(74) *Attorney, Agent, or Firm*—Steven Capella, Esq.; McGinn IP Law, PLLC (57) ABSTRACT

A barrier layer for fabricating at least one of a device and a mask includes a polymeric photoacid generator formed between a substrate and a resist layer. The barrier layer may be used, for example, in forming a resist image, and forming a patterned material feature on a substrate.

23 Claims, 3 Drawing Sheets

ULTRATHIN POLYMERIC PHOTOACID GENERATOR LAYER AND METHOD OF FABRICATING AT LEAST ONE OF A DEVICE AND A MASK BY USING SAID LAYER

BACKGROUND OF THE INVENTION

1. Field of the Invention

The present invention generally relates to the fabrication of devices and photomasks with optical, e-beam and x-ray exposures. In particular, the present invention relates to forming resist images (e.g., high resolution resist images) without profile distortion near the interface between resist and underlying structure beneath the resist.

2. Description of the Related Art

In the microelectronics industry, as well as other industries involving, for example, the making of micromachines, magnetoresistive heads, etc., there is a continued desire to reduce the size of microstructural devices. In particular, the microelectronics industry wishes to provide a greater amount of microelectronic circuitry within smaller electronic chips.

Reducing the size of microelectronic devices requires improved photolithographic techniques. Photolithographic techniques involve not only the formation of photo-imaged patterns on a substrate, such as a silicon wafer, but also the making of photomasks, usually called masks, that provide the patterns for the photo-imaging process.

New photolithographic techniques involve a movement in the industry to shorten the wavelength of exposure sources and use deep ultraviolet (UV) radiation and chemically amplified resists. Such photoresists offer the potential of forming images of smaller features than may be possible at longer wavelength exposure. As is recognized by those in the art, "deep UV radiation" refers to exposure radiation having a wavelength in the range of 350 nm or less, more typically in the range of 300 nm or less such as radiation provided by a KrF excimer laser light (248 nm) or an ArF excimer laser light (193 nm).

However, a significant disadvantage with chemically-amplified resists is their frequent sensitivity to the environment as well as the underlying substrate, which can result in reduced resolution of the resist relief image. In particular, resolution problems often occur upon coating onto substrates such as TiN, SiN, and SiON.

Deposition and processing of resists on nitride substrates is required for many microelectronic device fabrications. However, developed images of many current resists applied on TiN or other nitride substrates often will exhibit "footing" for positive tone resist (or "undercut" for the negative tone resist), where the resist fails to clear during development resulting in an upwardly tapering relief image sidewall.

The making of masks, usually a chrome on glass or quartz process, is similar to that of the conventional making of patterned silicon wafers for microelectronic circuits. A mask material (e.g., a chrome layer), is covered with a radiation-sensitive and chemically-amplified resist layer, which is then exposed to a pattern of imaging radiation. The resist layer is subsequently developed by contact with a developer (e.g., an aqueous alkaline developer), to selectively remove portions of the resist layer according to the pattern of imaging radiation. The pattern is subsequently transferred to an underlying substrate by etching those areas of the substrate, which have been exposed by the selective removal of portions of the resist layer. After transferring the pattern to the substrate, the remaining portions of the overlying resist layer are removed.

In the case where the underlying substrate is highly-reflective of the imaging radiation, reflection of the patterned imaging radiation back from the surface of the highly-reflective substrate into the overlying resist layer can cause a loss of fidelity in the transfer of the desired pattern to the underlying substrate. To prevent this loss of fidelity, a thin anti-reflective coating, such as a thin oxide layer, is formed between the resist layer and the underlying substrate.

In some masking processes, however, the inventors of the present invention have observed that such a thin oxide layer can also cause a loss of fidelity in the overlying resist layer by "poisoning" the resist layer, which causes footing. Footing is a condition in which the sidewalls of patterned resist layer do not meet the underlying substrate at a sharp well-defined angle. Instead, the base of the sidewall protrudes over the underlying substrate, in a manner similar to a foot protruding from the bottom of a leg.

Figure 5:
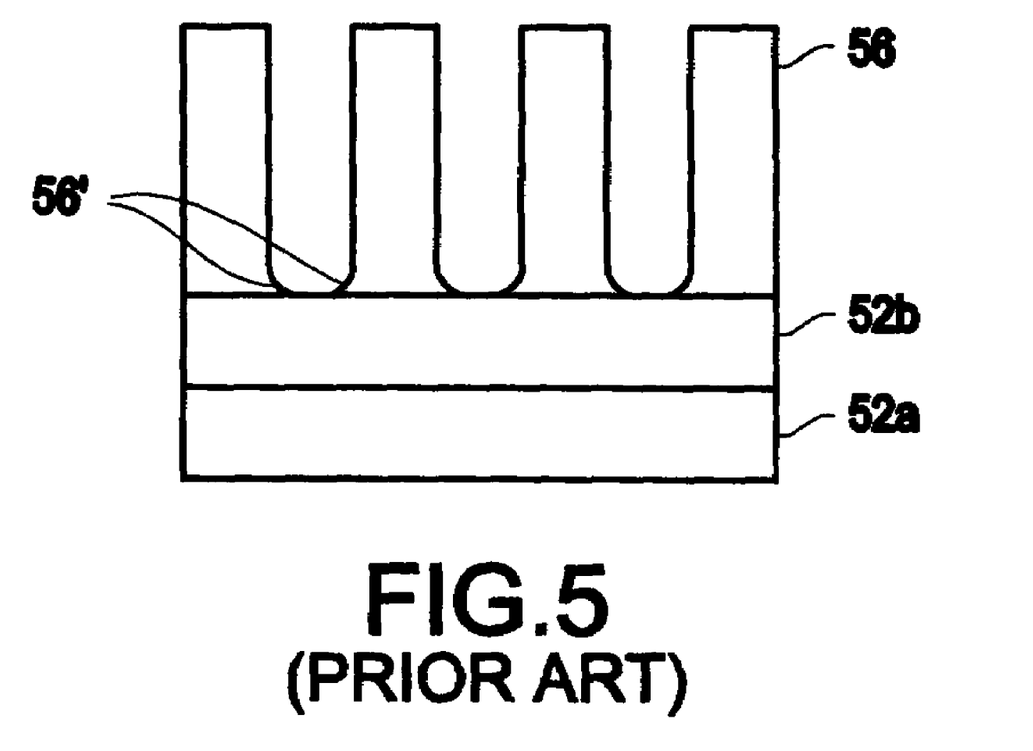
FIG. 5 illustrates a conventional structure including a resist layer 16.

For example, FIG. 5 illustrates a lithographic structure 50 in which a resist layer 56 is formed on a mask layer 52b (e.g., chrome plate), which was formed on a substrate 52a As illustrated in FIG. 5, during patterning, footing has occurred in portions 56' of the resist layer 56.

This footing, of course, degrades the transfer of the desired pattern from the overlying resist layer to the underlying substrate. This footing problem is similar to the nitride poisoning of the resist in device fabrication of Si wafers.

One conventional masking system attempts to resolve the footing problem on a titanium nitride substrate by using a thick layer (i.e., from 450 to 1200 Å) of an organic antireflective coating. With other substrate materials, however, such a thick organic antireflective coating can produce significant footing. It is thought that such footing occurs when the overlying thick resist layer is significantly eroded by subsequent etching processes. It has also been observed that a thinner antireflective coating does not cure the footing problem in these other masking systems.

Thus, there remains a need in mask fabrication to overcome the footing problem of an overlying resist layer formed on an antireflective coating of an inorganic oxide with an underlying metal substrate.

SUMMARY OF THE INVENTION

In view of the foregoing and other exemplary problems and disadvantages of conventional methods of fabricating devices and masks, it is a purpose of the exemplary aspects of the present invention to provide a barrier layer for device and mask fabrication which may help to eliminate footing, undercut problems and other exemplary problems experienced in conventional fabrication methods.

An exemplary aspect of the present invention includes a barrier layer for device and mask fabrication, which includes a polymeric photoacid generator formed between a substrate and a resist layer. The polymeric photoacid generator may be selected from a group consisting of a polymer including at least one acid-generating moiety and a copolymer comprising at least one acid-generating moiety.

Specifically, the polymeric photoacid generator may include a polymeric backbone; and a pendant-sensitive acid-generating moiety attached to the polymer backbone. Further, the acid-generating moiety may be selected from a group consisting of nitrobenzyl compounds, iodonium salts, sulfonium salts, sulfonates, carboxylates and a combination of any of these. In addition, the polymeric backbone may be selected from a group consisting of polyolefins, polyolefinsulfones, polyketones, polyethers, polysiloxanes, polysilsesquioxanes, polysilanes, polycarbosilanes and a combination of any of these.

Another exemplary aspect of the present invention includes a method of forming a resist image (e.g., high resolution resist image). The method includes forming a barrier layer between a substrate and a resist layer, the barrier layer comprising a polymeric photoacid generator.

Further, the polymeric backbone may include polyethylene. In addition, the barrier layer may further include a crosslinker (e.g., for crosslinking the polymer backbone).

The resist may be selected from a group consisting of a positive tone chemically amplified resist and a negative tone chemically amplified resist. Further, the substrate may be selected from a group consisting of a glass plate, plastic plate, quartz plate, a mask membrane and a semiconductor wafer.

Further, the substrate may also include (e.g., on a surface of the substrate) at least one material layer including a material which is selected from a group consisting of semiconductors, conductors, ceramics, and organic dielectrics. The substrate may further include (e.g., thereon) a material layer coating including at least one member selected from a group consisting of TiN, SiN, SiON, $Cr_xO_y$, and a combination of any of these.

Another exemplary aspect of the present invention includes a method of forming a patterned material feature on a substrate. The method includes forming a barrier layer on a material layer, the barrier layer comprising a polymeric acid generator, forming a radiation-sensitive imaging layer on the barrier layer, and patternwise exposing the imaging layer to radiation, thereby creating a pattern of radiation-exposed regions in the imaging layer, selectively removing portions of the imaging layer and the barrier layer to expose portions of the material layer, and processing (e.g., etching, electroplating, metal depositing or ion implanting) the exposed portions of the material layer, thereby forming the patterned material features in the material layer. For example, the radiation-sensitive imaging layer may include a chemically amplified resist.

Another exemplary aspect of the present invention includes a polymeric photoacid generator (e.g., for a barrier layer used in device and mask fabrication) which includes an organic moiety of:

where $R_3$ and $R_4$ independently represent an alkyl group, an aryl group or other organic group. A specific example of such polymeric photoacid generator includes one member selected from the group consisting of:

-continued

BRIEF DESCRIPTION OF THE DRAWINGS

The foregoing and other exemplary aspects of the present invention will be better understood from the following detailed description of exemplary embodiments of the present invention with reference to the drawings in which.

DETAILED DESCRIPTION OF EXEMPLARY EMBODIMENTS OF THE INVENTION

Referring to the drawings, and more particularly to FIGS. 1-4, the exemplary aspects of the present invention include a barrier layer 14 which may be used for device fabrication and mask fabrication. The barrier layer 14 includes a polymeric photoacid generator formed between a substrate 12 and a resist layer 16.

Specifically, the barrier layer according to the exemplary aspects of the present invention may be interposed between a substrate and an overlying radiation-sensitive, chemically-amplified resist layer to substantially reduce footing of the resist layer for high fidelity patterning of the underlying substrate. The barrier layer may include, for example, an ultrathin (e.g. less than about 200 Å) polymeric photoacid generator layer.

Figure 2A:
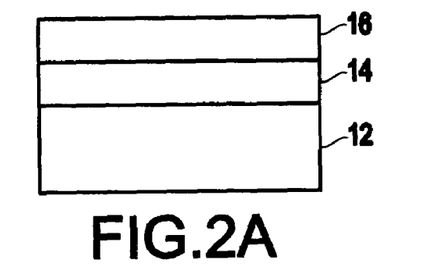
FIGS. 2A-2E illustrate cross-sectional views of a structure including the barrier layer 14, during forming of a patterned material feature on a substrate, in accordance with the exemplary aspects of the present invention.

For example, as illustrated in FIGS. 2A-2D, the barrier layer may be used during device (e.g., semiconductor device) fabrication and/or mask (e.g., photomask) fabrication to address the problem of footing which is prevalent in conventional methods. Specifically, as illustrated in FIG. 2A, the barrier layer 14 may be formed on a substrate 12 (e.g., a semiconductor substrate). For mask fabrication, the substrate may include a mask material (e.g., a chrome layer). Further, a thin anti-reflective coating, such as a thin oxide layer, may also be formed between the barrier layer 14 and the underlying substrate 12.

Figure 2B:
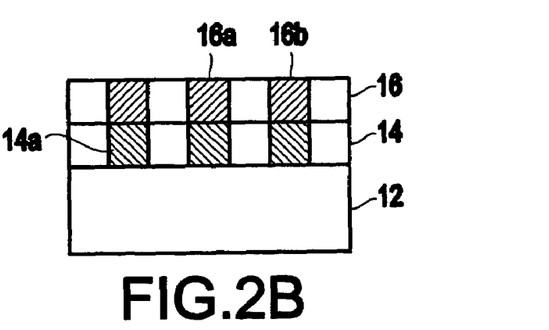
Figure 2C:
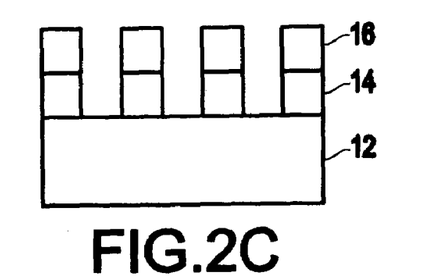

A resist layer 16 (e.g., radiation-sensitive and chemically-amplified resist layer) may be formed on the barrier layer 14. The resist layer 16 may be exposed to a pattern of imaging radiation to form irradiated portions 16a and non-irradiated portions 16b of the resist layer, as illustrated in FIG. 2B. The resist layer 16 may be subsequently developed by contact with a developer (e.g., an aqueous alkaline developer), to selectively remove portions (e.g., irradiated portions 16a if the resist is positive tone (e.g., as illustrated in FIG. 2C), or non-irradiated portions 16b if the resist is negative tone) of the resist layer 16 according to the pattern of imaging radiation, to form a patterned resist.

In addition, the barrier layer 14 may be exposed to a pattern of imaging radiation (e.g., the same radiation to which the resist layer was exposed) to form irradiated portions 14a of the barrier layer. Further, portions of the barrier layer 14 (e.g., the irradiated portions) may also be removed (e.g., concurrently with removing portions of the resist layer) as illustrated in FIG. 2C, to expose a surface of the substrate 12. It also can be removed separately or in the step of FIG. 2D.

Figure 2D:
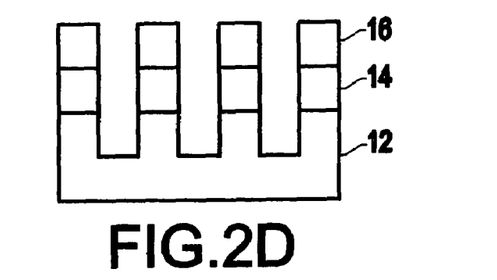
Figure 2E:
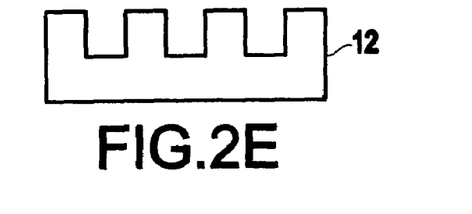

The pattern may be subsequently transferred to an underlying substrate 12 (e.g., a mask layer or a device layer such as a silicon wafer) by etching those areas of the substrate, which have been exposed by the selective removal of portions of the resist layer and portions of the barrier layer, as illustrated in FIG. 2D. After transferring the pattern to the substrate 12 (e.g., mask layer), the remaining portions of the overlying resist layer may be removed, as illustrated in FIG. 2E.

As illustrated in FIG. 2D, the barrier layer 14 of the present invention may be used to inhibit the occurrence of "footing" (e.g., or undercut for a negative tone resist) during device and/or mask fabrication. The inventors have determined that basic components (e.g., OH⁻ containing components) which may be present in or around the substrate 12 may neutralize acid produced during a patterning process resulting in the occurrence of footing. Such basic components may be generated, for example, by the reaction of nitride compounds (e.g., or amine compounds) with water.

However, the acid generated by the barrier layer 14 (e.g., when irradiated) in the exemplary aspects of the present invention, may be used to neutralize such basic components, thereby preventing a "poisoning" of the resist layer and inhibiting the occurrence of "footing" during device and/or mask fabrication.

Further, the barrier layer 14 of the present invention may be "ultrathin" and may be, for example, less than 500 Å or less than 200 Å, depending upon the application. In addition, the barrier layer is stable. That is, there is no leaching concern with the photoacid generator in the barrier layer of the present invention. Further, there is no acid leaching concern from the barrier layer, resulting in a long shelf life.

The polymeric photoacid generators of the present invention may be characterized by the presence of a polymer or copolymer consisting at least one acid-generating moiety. Lithographic structures containing the barrier layer including a photoacid generator composition of the present invention, as well as methods of using such structure to pattern underlying material layers on a substrate are as described herein.

Further, the barrier layer may be interposed between the substrate and radiation-sensitive chemically amplified resist to prevent substrate effect on a photoresist layer, such as footing to positive tone resist or undercut for the negative tone resist. One exemplary aspect of the invention provides such a barrier layer including (e.g., consisting of) a polymeric photoacid generator, the polymeric photoacid generator including (e.g., consisting of) a polymer or copolymer, the polymer or copolymer including an acid-generating moiety in the backbone.

More specifically, the polymer or copolymer described hereinabove can be represented by a structure preferably including one or more monomers selected from the group consisting of:

where $R_1$ contains organic moieties, organic metallic moieties or silicon moieties or the mixtures thereof, and Q contains an acid-generating moiety. The acid-generating moieties may include, for example, a photoacid generator which is typical in the photoresist industry.

Examples of preferred photoacid generators (PAGs) include: .alpha.-(trifluoromethylsulfonyloxy)-bicyclo[2.2.1] hept-5-ene-2,3-dicarboximide (MDT), onium salts, aromatic diazonium salts, sulfonium salts, diaryliodonium salts and sulfonic acid esters of N-hydroxyamides or -imides, as disclosed, for example, in U.S. Pat. No. 4,731,605. Also, a PAG that produces a weaker acid such as dodecane sulfonate of N-hydroxy-naphthalimide (DDSN) may be used. Combinations of different PAGs may also be used.

Generally, suitable acid generators have a high thermal stability (preferably to temperatures greater than 140 degrees C.) so they are not degraded during pre-exposure processing. In addition to MDT and DDSN, suitable sulfonate compounds are sulfonate salts, but other suitable sulfonate PAGs include sulfonated esters and sulfonyloxy ketones. For example, see U.S. Pat. No. 5,344,742 to Sinta et al., and *J. Photopolymer Science and Technology*, 4:337-340 (1991), for a list of suitable sulfonate PAGs, including benzoin tosylate, t-butylphenyl .alpha.-(p-toluenesulfonyloxy)-acetate and t-butyl .alpha.-(p-toluenesulfonyloxy)-acetate.

Onium salts are also generally preferred acid generators of compositions of the invention. Onium salts that contain weakly nucleophilic anions have been found to be particularly suitable. Examples of such anions are the halogen complex anions of divalent to heptavalent metals or non-metals, for example, Sb, B, P, and As. Examples of suitable onium salts include aryl-diazonium salts, halonium salts, aromatic sulfonium salts and sulfoxonium salts or selenium salts (e.g., triarylsulfonium and diaryliodonium hexafluoroantimonates, hexafluoroarsenates, and trifluoromethanesulfonates). Examples of preferred onium salts can be found, for example, in U.S. Pat. Nos. 4,442,197, 4,603,101, and 4,624,912. Other useful acid generators include the family of nitrobenzyl esters, and the s-triazine derivatives. Suitable s-triazine acid generators are disclosed, for example, in U.S. Pat. No. 4,189, 323.

Still other suitable acid generators include N-camphorsulfonyloxynaphthalimide, N-pentafluorophenylsulfonyloxynaphthalimide, ionic iodonium sulfonates, e.g., diaryl iodonium (alkyl or aryl) sulfonate and bis-(di-t-butylphenyl) iodonium camphanylsulfonate, perfluoroalkanesulfonates, such as perfluoropentanesulfonate, perfluorooctanesulfonate, perfluoromethanesulfonate; aryl (e.g., phenyl or benzyl) triflates and derivatives and analogs thereof, e.g., triphenylsulfonium triflate or bis-(t-butylphenyl)iodonium triflate; pyrogallol derivatives (e.g., trimesylate of pyrogallol); trifluoromethanesulfonate esters of hydroxyimides, a,.alpha.'-bis-sulfonyl-diazomethanes; sulfonate esters of nitro-substituted benzyl alcohols; naphthoquinone-4-diazides; and alkyl disulfones.

Other suitable photoacid generators are disclosed, for example, in Reichmanis et al. (1991), *Chemistry of Materials*, 3:395, and in U.S. Pat. No. 5,679,495 to Yamachika et al. Additional suitable acid generators useful in conjunction with the compositions and methods of the invention will be known to those skilled in the art and/or are described in the pertinent literature.

In one exemplary aspect of the present invention, the barrier layer includes a polymeric photoacid generator having a polymeric backbone, and a pendant-sensitive acid-generating moiety attached to the backbone. More specifically, the polymeric photoacid generator may include one or more monomers selected from the group consisting of:

where $R_2$ and A can be the same or different and may contain organic moieties, organometallic moieties, silicon containing moieties, or the mixtures thereof, and Q may contain an acid-generating moiety.

Further, the polymeric photoacid generator may contain a polymeric backbone including but not limited to: polyolefins, polyolefinsulfones, polyketones, polyethers, polysiloxanes, polysilsesquioxanes, polysilanes, and polycarbosilanes. More specifically, in various exemplary embodiments of the present invention, the polymer may include a backbone of, for example, polymethyl methacrylate (PMMA), polyhydroxystyrene (PHS), polymer-bound 9-anthracene methanol (Polysen) or a polymer which is well known in the art.

A pendant radiation-sensitive, acid-generating moiety such as, for example, a dimethyl sulfonium perfluorobutane sulfonate group, may be added to, for example, the PMMA, PHS, and Polysen polymeric backbones to form a PMMA type polymeric photoacid generator (PAG), a PHS type polymeric PAG, and a Polysen type PAG, respectively. Examples of chemical structures for these types of polymeric photoacid generators are shown below:

PMMA type polymer

-continued

In another exemplary embodiment of the present invention, the barrier layer may include a crosslinker (e.g., crosslinking agent) to prevent the barrier layer from dissolving in the resist solvent after coating and baking the barrier layer. The preferred crosslinkers are those that can thermally induce crosslinking of the polymeric photoacid generators to form an insoluble film toward common resist solvents.

Suitable organic cross-linking agents useful in the present invention include, but are not limited to: amine containing compounds, epoxy containing materials, compounds containing at least two vinyl ether groups, allyl substituted aromatic compounds, compounds containing at least two or more diazonaphthoquinone sulfonic acid ester groups and combinations thereof. Preferred cross-linking agents include amine containing compounds, compounds containing at least two vinyl ether groups, and compounds containing at least two or more diazonaphthoquinone sulfonic acid ester groups.

The amine containing compounds useful as cross-linking agents in the present invention include, but are not limited to: melamine monomers, melamine polymers, alkylolmethyl melamines, benzoguanamine resins, benzoguanamine-formaldehyde resins, urea-formaldehyde resins, glycoluril-formaldehyde resins, and combinations thereof. These resins may be prepared by the reaction of acrylamide or methacrylamide copolymers with formaldehyde in an alcohol-containing solution, or alternatively by the copolymerization of N-alkoxymethylacrylamide or methacrylamide with other suitable monomers.

Particularly suitable amine-based crosslinkers include the melamines manufactured by Cytec of West Paterson, N.J., such as CYMEL.™. 300, 301, 303, 350, 370, 380, 1116 and 1130; benzoguanamine resins such as CYMEL.™. 1123 and 1125; the glycoluril resins CYMEL.™. 1170, 1171 and 1172; and the urea-based resins BEETLE.™. 60, 65 and 80, also available from Cytec, West Paterson, N.J. A large number of similar amine-based compounds are commercially available from various suppliers.

Melamines are the preferred amine-based cross-linkers. Particularly preferred are alkylolmethyl melamine resins. These resins are typically ethers such as trialkylolmethyl melamine and hexaalkylolmethyl melamine. The alkyl group may have from 1 to 8 or more carbon atoms but is preferably methyl. Depending upon the reaction conditions and the concentration of formaldehyde, the methyl ethers may react with each other to form more complex units.

Compounds containing at least two vinyl ether groups include, but are not limited to divinyl ethers of aliphatic, cycloaliphatic, aromatic or araliphatic diols. Examples of such materials include divinyl ethers of aliphatic diols having from 1 to 12 carbon atoms, polyethylene glycols, propylene glycols, polybutylene glycols, dimethylcyclohexanes, and the like. Particularly useful compounds having at least two vinyl ether groups include divinyl ethers of ethylene glycol, trimethylene-1,3-diol, diethylene glycol, triethylene glycol, dipropylene glycol, tripropylene glycol, resorcinol, Bisphenol A, and the like.

The compounds containing at least two or more diazonaphthoquinone sulfonic acid ester groups as suitable crosslinking agent are those photoactive compounds used in the state of art I-line resists. The compounds are typically the condensation products of diazpnaphthoquinone sulfonic acids and diol or polyol.

In the various exemplary aspects and embodiments of the present invention, the barrier layer compositions of the present invention may typically contain a solvent prior to their application to the desired substrate. The solvent or solvents well known to those in the art may be employed in various polymeric type PAGs to form barrier layer composition. Such solvents may be used to dissolve regular resists. Illustrative examples of such solvents may include, but are not limited to: glycol ethers, aromatic hydrocarbons, ketones, esters and the like.

Suitable glycol ethers that can be employed in the present invention include: 2-methoxyethyl ether (diglyme), ethylene glycol monomethyl ether, propylene glycol monomethyl ether and the like. Examples of aromatic hydrocarbons that may be employed in the present invention include toluene, xylene and benzene; examples of ketones include methylethyl ketone, cyclohexanone and cycloheptanone; and examples of esters include propylene glycol monomethyl ether acetate (PGMEA), ethyl lactate, and ethyl ethoxypropionate. Of the solvents mentioned hereinabove, the preferred ester is PGMEA, the preferred ketone is cyclohexanone.

The surfactants that can optionally be employed in the present invention may be capable of improving the coating homogeneity of the barrier layer of the present invention. Illustrative examples of such surfactants include: fluorine-containing surfactants such as 3M's-FC-430 and siloxane-containing surfactants such as Union Carbide's SILWET series and the like.

The barrier layer compositions of the present invention may preferably include about 0.3 to about 16 wt. % of the polymeric photoacid generator, more preferably about 0.6 to about 6 wt. % of the polymeric photoacid generator. The barrier layer compositions may further contain a crosslinker preferably in the range about 0.006 wt. % to about 8 wt. %, more preferably about 0.012 wt. % to about 3 wt. %. Where the barrier layer compositions of the invention includes a solvent, the overall composition preferably includes about 84 to 99.7 wt. % solvent.

The barrier layer of present invention can be used in combination with basically any desired resist material in forming a lithographic structure. Such a lithographic structure is shown, for example, in FIG. 1. Specifically, the lithographic structure 10 of FIG. 1 includes a substrate 12 for patterning, the barrier layer 14, and a resist 16.

Figure 1:
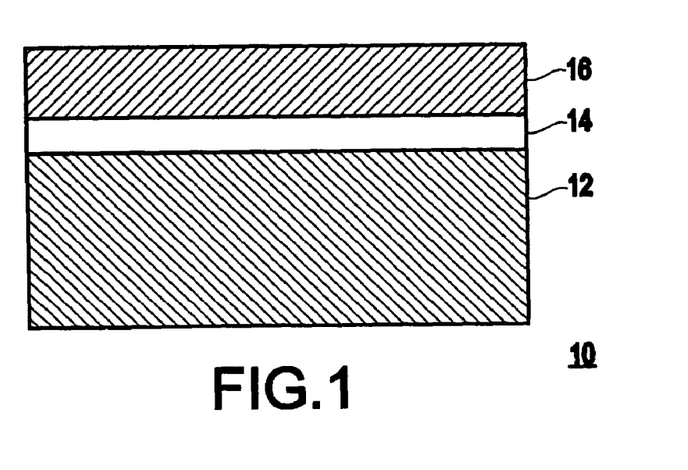
FIG. 1 illustrates a cross-sectional view of a structure including a barrier layer 14 in accordance with the exemplary aspects of the present invention.

The resist 16 is preferably imageable with ultraviolet radiation (e.g.,<400 nm wavelength), e.g. 365, 248, 193, 157 nm, EUV, X-ray or with electron beam radiation or electron beam laser. Examples of suitable resist materials are described, for example, in U.S. Pat. Nos. 5,861,231; 5,962,184; and 6,037,097.

Referring again to FIG. 1, the substrate 12 may include, for example, a glass plate, plastic plate, quartz plate, a membrane or a wafer. A preferred substrate may include, for example, a quartz plate or silicon wafer.

Further, the substrate may include various types of material layers. The material layers may be formed, for example, on the surface of a substrate, and may be selected, for example, from semiconductor materials, conductive materials, ceramic materials, and organic dielectric materials or other materials typical of device (e.g. semiconductor device) and/or mask fabrication. For example, the substrate may include a silicon wafer, a dielectric layer formed on the wafer, a conductive layer formed on the dielectric layer, and so on.

Examples of semiconductor materials that can be employed in the present invention include, but are not limited to: Si, SiGe, SiC, SiGeC, Ge, GaAs, InAs, InP, silicon-on-insulators (SOIs), SiGe-on-insulators (SGOIs). The dielectric materials that can be employed in the present invention include any inorganic or organic dielectric material. The inorganic dielectric materials may include ceramic materials and are typically oxides, nitrides or oxynitrides.

Examples of ceramic materials include, but are not limited to: $SiO_2$, $Al_3O_4$, $TiO_2$, perovskite type oxides, TiN, SiN, SiON, and $Cr_xO_y$. The conductive materials that can be employed in the present invention include, but are not limited to: doped polysilicon, and elemental metals such as Cu, W, Al, Pt, and Pd, alloys of the foregoing elemental metals, and suicides thereof.

Figure 3:
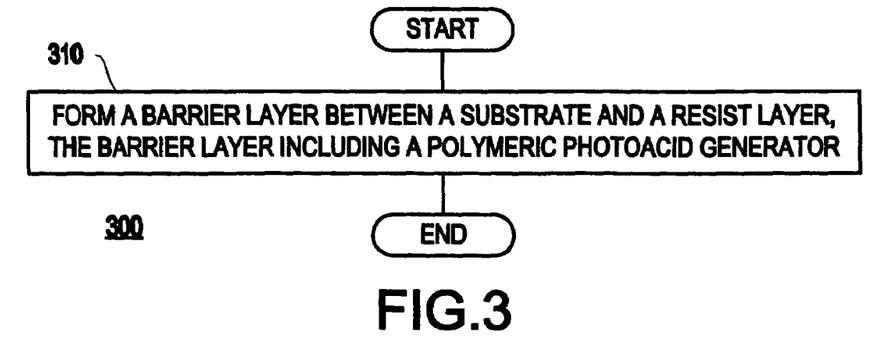
FIG. 3 illustrates a method 300 of forming a resist image (e.g., high resolution resist image), in accordance with the exemplary aspects of the present invention.

As illustrated in FIG. 3, another exemplary aspect of the present invention includes a method 300 of forming a resist image (e.g., high resolution resist image). The method 300 includes forming (310) a barrier layer between a substrate and a resist layer, the barrier layer including a polymeric photoacid generator. The method may also include forming the resist on the barrier layer.

Figure 4:
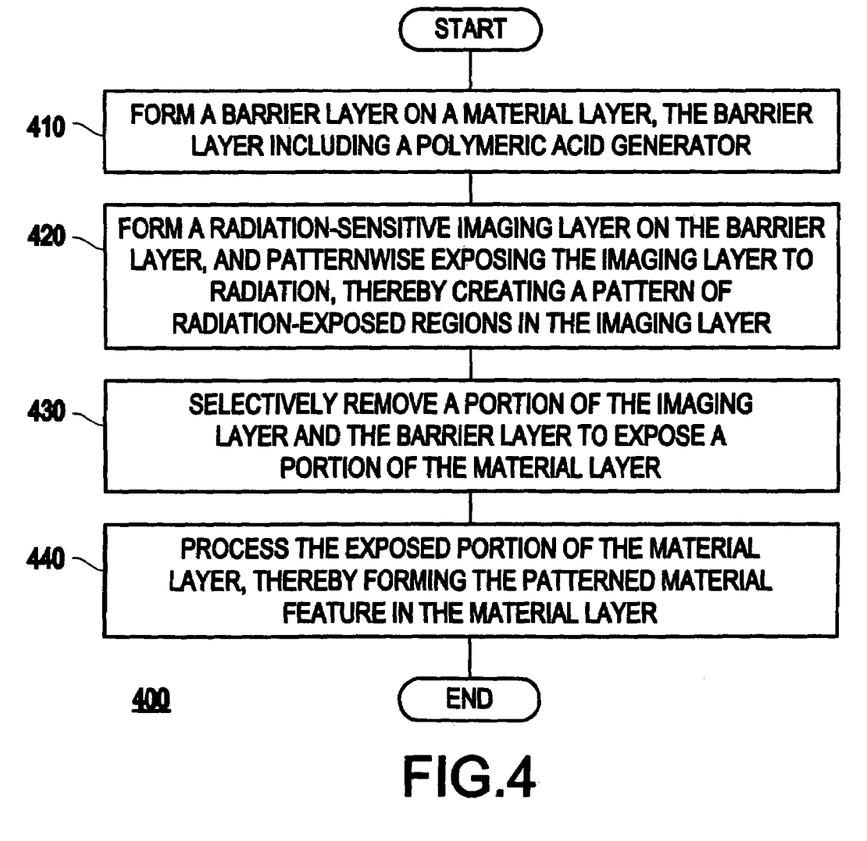
FIG. 4 illustrates a method 400 of forming a patterned material feature on a substrate in accordance with the exemplary aspects of the present invention.

In addition, as illustrated in FIG. 4, another exemplary aspect of the present invention includes a method 400 of forming a patterned material feature on a substrate. The method 400 includes forming (410) a barrier layer on a material layer (e.g., a substrate having a material layer formed thereon), the barrier layer including a polymeric acid generator, forming (420) a radiation-sensitive imaging layer over the barrier layer, and patternwise exposing the imaging layer to radiation to create a pattern of radiation-exposed regions in the imaging layer, selectively removing (430) portions of the imaging layer and the barrier layer to expose portions of the material layer, and processing (440) (e.g., etching, electroplating, metal depositing or ion implanting) the exposed portions of the material layer, to form the patterned material features. The exposed resist layer may be baked to promote an acid-catalyzed reaction in the exposed portion of the resist layer.

The barrier layer may be formed on the substrate by spin coating followed by baking to remove solvent and crosslinking if crosslinker is present in the composition. The baking is preferably conducted about 280° C. or less, more preferably about 90° C. to about 250° C., and most preferably about 160° C. to about 230° C. The baking time may vary depending on the layer thickness and bake temperature. A typical baking time is about 1-3 minutes. The thickness of the barrier layer of the invention may be varied depending the substrate or other factors. The preferred thickness may be less than 50 nm.

To form a radiation-sensitive imaging layer over the barrier layer, the solvent-containing resist composition may be applied using spin coating or other technique. The substrate with the resist coating is then preferably heated (pre-exposure baked) to remove the solvent and improve the coherence of the resist layer. The thickness of the applied layer is preferably as thin as possible with the provisos that the thickness is preferably substantially uniform and that the resist layer is sufficient to withstand subsequent processing (typically reactive ion etching) to transfer the lithographic pattern to the underlying substrate material layer. The pre-exposure bake step is preferably conducted for about 10 seconds to about 15 minutes, more preferably about 15 seconds to about 5 minutes. The pre-exposure bake temperature may vary depending on the glass transition temperature of the photoresist.

After solvent removal, the resist layer is then patternwise-exposed to the desired radiation (e.g., 193 nm ultraviolet radiation). When scanning particle beams such as electron beam are used, patternwise exposure may be achieved by scanning the beam across the substrate and selectively applying the beam in the desired pattern.

After the desired patternwise exposure, the resist layer is typically baked to further complete the acid-catalyzed reaction and to enhance the contrast of the exposed pattern. The post-exposure bake is preferably conducted at about 60° C. to about 175° C., more preferably about 90° C. to about 160° C. The post-exposure bake is preferably conducted for about 30 seconds to about 5 minutes.

After post-exposure bake, the resist structure with the desired pattern is obtained by contacting the resist layer with an alkaline solution, which selectively dissolves the areas of the resist which were exposed to radiation. Preferred alkaline solutions (developers) are aqueous solutions of tetramethyl ammonium hydroxide. The resulting lithographic structure on the substrate is then typically dried to remove any remaining developer solvent.

The pattern from the resist structure may then be transferred to the exposed portions of the layer of barrier layer of the invention by etching with $CF_4$, $Cl_2$, $N_2/H_2$, $O_2$, $NH_3/C_2H_4$, or other suitable etchant using techniques known in the art.

After the opening of the barrier layer of the invention and any underlying antireflective coating, the underlying material layer to be patterned may then be etched using an etchant appropriate to the material layer composition. When the material layer is a metal (e.g., Cr) a combination of $Cl_2/O_2$ may be used as a dry etchant. Once the desired pattern transfer has taken place, any remaining resist and barrier layer may be removed using conventional stripping techniques.

In one embodiment, the compositions and resulting lithographic structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices. The method of the present invention are especially useful in the context of creating patterned metal structures, especially Cr-based structures useful as masks.

EXAMPLE 1

Synthesis of Poly[methyl methacrylate-co-(4-acryloxynaphth-1-yl dimethylsulfonium nonafluorobutanesulfonate)] (95:5) (PMMA-DMS PFBUS)

a. 4-Acryloxynaphth-1-yl dimethylsulfonium chloride: Sodium methoxide (2.3 mL of 25% solution in methanol) may be added to a solution of 4-hydroxynaphth-1-yl dimethylsulfonium chloride (2.4 g) in acetonitrile (50 mL). To this may be added acryloyl chloride (0.8 mL) which results in an exothermic reaction. The reaction mixture may be stirred overnight and evaporated the next morning. The product may be taken up into dichloromethane and washed twice with water. The organic layer may then be dried with magnesium sulfate and evaporated to give a brownish oil (2.8 g, yield 95%).

b. 4-Acryloxynaphth-1-yl dimethylsulfonium nonafluorobutanesulfonate: The sulfonium chloride (2.8 g) may be dissolved into a mixture of 75 mL dichloromethane and 75 mL water. To this may be added potassium nonafluorobutanesulfonate (3.4 g). The reaction mixture may be stirred vigorously overnight. The organic layer may then be separated and the water layer extracted with additional dichloromethane (20 mL). The combined organics may then be washed with water (50 mL), dried using magnesium sulfate, and evaporated to give a white solid.

c. 4-Acryloxynaphth-1-yl dimethylsulfonium nonafluorobutanesulfonate: 4-Hydroxynaphth-1-yl dimethylsulfonium nonafluorobutanesulfonate (2.4 g) may be dissolved in acetonitrile (50 mL) followed by sodium methoxide (1.1 mL of 25% solution in methanol) at room temperature. Next acryloyl chloride may be added (0.4 g) to result in immediate formation of a white solid. The reaction mixture may be stirred overnight and the solvent then evaporated. The residue may be taken up into dichloromethane, washed twice with water, the organic layer dried with magnesium sulfate, and then evaporated leaving a white solid (2.6 g).

d. Poly[methyl methacrylate-co-(4-acryloxynaphth-1-yl dimethylsulfonium nonafluorobutanesulfonate)] (95:5): The acryloxysulfonium nonaflate (1.0 g), methyl methacrylate (3.6 g), AIBN (63 mg) and tetrahydrofuran (2 g) may be placed in a vial, degassed and heated to 60° C. in an oil bath overnight. After 18 hours, the heat may be removed and the reaction solidified. The reaction mixture may be reheated to 60° C. and tetrahydrofuran added to dissolve the polymer, which may then be precipitated into hexanes (500 mL). The precipitate may then be filtered to give a stringy white solid (2.4 g) Mw/Mn=238,000/49,000 by GPC relative to polystyrene standards. The resultant product showed incorporation of sulfonium salt of approximately 4.8 mole % as determined by H-NMR.

EXAMPLE 2

Ortho grafting of dimethyl sulfonium perfluorobutane sulfonate group to poly(4-hydroxystyrene) to form poly[(4-hydroxystyrene)-co-(3-dimethylsulfonium perfluorobutanesulfonate-4-hydroxystyrene)] (PHS-DMS PFBUS)

4.41 g of dimethylsulfoxide may be slowly added to ~30 ml of Eaton's Reagent (from Aldrich, 7.7 wt. % of $P_2O_5$ in methanesulfonic acid), producing a hot solution. The mixed solution may then be slowly added to 9 g of polyhydroxystyrene (VP2500 from Tomen), which may then be dried under Ar at 70° C., overnight, in a water bath. After completion of adding the mixed solution to the polymer, the water bath may be removed and the reaction mixture may be stirred at room temperature overnight. The reaction mixture may turn dark overnight. The reaction mixture may then be added dropwise to 500 ml of distilled water. The resulting solution may then be filtered through filter paper and the resulting trace amount of solid on the filter paper may be washed with an extra 150 ml of distilled water. A solution 19 g of potassium perfluorobutanesulfonate (KPFBuS) in 200 mL water may be added to the filtrate. The mixture may then be allowed to stir for a few hours. The precipitate may be collected by suction filtration and washed with copious amount of water. The collected polymer solid may then be dried in vacuum oven at 50° C. overnight to yield approximately 20 g of product. The polymer may be dissolved in 60 g of acetone, added in 10 g of basic aluminum oxide, rolled on a roller for a few hours, and may then be allowed to sit overnight. The aluminum oxide may be filtered and the polymer may be precipitated out from distilled water and collected by suction filtration and washed with copious amount of water. The collected polymer solid may then be dried in vacuum oven at 50° C. overnight to yield approximately 12.4 g of product.

EXAMPLE 3

Ortho Grafting of Dimethyl Sulfonium Perfluorobutane Sulfonate Group to Polymer-Bound 9-Anthracene Methanol (Polysen) to form a Polymeric PAG (Polysen-DMS PFBUS)

a. Preparation of Polymer-Bound 9-Anthracene Methanol (Polysen):

75 grams (g) of poly-4-hydroxystyrene (PHS) may be dissolved in 300 milliliters of acetonitrile. 26 g of ANME may be added to the solution. When the ANME is completely in solution, 1.0 g of p-toluenesulfonic acid may be added and the solution refluxed for seventeen hours. The reaction mixture may be cooled and neutralized with aqueous ammonium hydroxide. The resulting solution may be added drop wise into one liter of deionized water and stirred for thirty more minutes. The precipitate obtained may be filtered, washed twice with deionized water, and dried in vacuo.

b. Ortho grafting of dimethyl sulfonium perfluorobutane sulfonate group to polysen to form a polymeric PAG (Polysen-DMS PFBUS):

2.6 g of dimethylsulfoxide may be slowly added to ~20 ml of Eaton's Reagent (from Aldrich, 7.7 wt. % of $P_2O_5$ in methanesulfonic acid), producing a hot solution. The mixed solution may then be slowly added to 6 g of polysen prepared described in section a above, which was dried under Ar at 70° C., overnight, in a water bath. After the completion of adding the mixed solution to the polymer, the water bath may be removed and the reaction mixture may be stirred at room temperature overnight. The solution may then be added dropwise to 300 ml of distilled water. The resulting solution may then be filtered through filter paper and the resulting trace amount of solid on the filter paper may be washed with extra 50 ml of distilled water. A solution 11.25 g of potassium perfluorobutanesulfonate (KPFBuS) in 100 mL water may be added to the filtrate. The mixture may then be allowed to stir for a few hours. The precipitate may be collected by suction filtration and washed with copious amount of water. The collected polymer solid may then be dried in vacuum oven at 50° C. overnight to yield approximately 11 g of product. The polymer may be dissolved in 30 g of acetone, added in 5 g of basic aluminum oxide, rolled on a roller for a few hours, and then may be allowed to sit overnight. The aluminum oxide may be filtered and the polymer may be precipitated out from distilled water and collected by suction filtration and washed with a copious amount of water. The collected polymer solid may then be dried in vacuum oven at 50° C., overnight, to yield approximately 8.1 g of product.

EXAMPLE 4

Formulation and Optical Properties of Polymeric PAG Solutions 160 mg of PHS-DMS PFBUS polymer, synthesized in Example 1, and 40 mg of 4,8-bis(6-diazo-5,6)-dihydro-5-oxo-1-naphthalene-sulfonyloxy-1'-yl)tricyclo-[5.2.1.0.sup.2,6] decane (TDQ) may be dissolved in 19.8 g of cyclohexanone to form a solution with 1 wt % solid content. The formulated solution may be spin-coated on silicon wafer at 2000 rpm and baked on a hot plate at 170° C. for 180s. n and k values (e.g., the real and imaginary parts of the refractive index of the polymeric PAGs, respectively) may be measured, for example, with a VB-250 VASE Ellipsometer, manufactured by J. A. Woollam Co. Inc. The optical properties of a 170 Å film for 248 and 258 nm radiation are as follows:

| Wavelength | N | k |
|---|---|---|
| 248 nm | 1.732 | 0.0642 |
| 258 nm | 1.693 | 0.0461 |

The same formulation and process may be carried out on the Polysen-DMS PFBUS, except that the baking temperature was about 165° C. The optical properties of the 170 Å film for 248 and 258 nm radiation are as follows:

| Wavelength | N | k |
|---|---|---|
| 248 nm | 1.673 | 0.187 |
| 258 nm | 1.704 | 0.211 |

EXAMPLE 5

(Comparison) Resist on Top of an Inorganic Antireflective Film Including Chromium (AR3, from Hoya Corporation)

Resist formulations may be obtained by using a partially protected polymer. The preparation of such polymers is taught, for example, in U.S. Pat. Nos. 5,919,597 and 6,037,097 and 6,043,003.

The protection level is about 25%. The polymer in propylene glycol methyl ether acetate (PGMEA) solvent may be mixed with 0.14 wt. % (relative to the polymer) tetrabutyl ammonium hydroxide (TBAH), and 0.7 wt. % triphenylsulfonium triflate (TPS-TRF). The total solid weight content in the solution is about 12%. Chrome on quartz wafers may be used as the substrate. These wafers, purchased from Hoya Corporation, have an antireflective chrome containing film (AR3) deposited on the substrate that is identical in chemical composition to the chromium-containing layer commonly used in mask blanks. The wafers may be cleaned in a solution of sulfuric acid and hydrogen peroxide, followed by a dehydration bake for about 5 minutes at about 115° C. The resist may be spin-coated onto the AR3 chrome on quartz wafer, followed by a hot plate bake step at about 110° C. for about 1 minute. The resist may then be exposed on, for example, an IBM-built high throughput e-beam projection system at 75 kV. After exposure, the resist may be allowed to stand at room temperature for about 30 minutes before being developed with 0.263 N TMAH for about 60 seconds. The resulting resist profile has a significant amount of residue between the features, and the profile had a large amount of footing.

EXAMPLE 6

Resist on Top of PMMA, and PMMA-DMS PFBUS polymeric PAG over an Inorganic Antireflective Film Including Chromium (AR3)

PMMA and PMMA-DMS PFBUS, synthesized in Example 1, may be dissolved in cyclohexanone to form polymer solutions with a solid content of about 1.5 wt %. Both polymer solutions may applied on top of chrome on quartz wafers having an inorganic antireflective film including chrome (AR3), and the polymer films may be spin-coated at 2500 rpm and then baked at about 180° C. for about 90s. The obtained thickness of both films is in the range of about 250 to about 300 Å. The resist, as described in Example 5, may then be spin-coated on top of both PMMA and PMMA-DMS PFBUS films and baked at 110° C. for about 1 minute. Both wafers may be exposed with, for example, a 100 kV Leica E-beam exposure tool. After exposure, the resist may be allowed to stand at room temperature for about 30 minutes before being developed with 0.263 N TMAH for about 60 seconds. The resulting resist profile on top of PMMA film has reduced footing in comparison to that observed in Example 5. The resulting resist profile on top of PMMA-DMS PFBUS polymeric PAG film shows very little foot.

EXAMPLE 7

Resist on top of PHS-DMS PFBUS Polymeric PAG over an Antireflective Chromium Containing Film (AR3)

PHS-DMS PFBUS, synthesized in Example 2, combined with TDQ, may be formulated as in Example 4, in cyclohexanone to form polymer solutions with solid content of about 1 wt %. The polymer solutions may be applied on top of chrome on quartz wafers having an inorganic antireflective film including chrome (AR3), and the polymer film may be spin-coated and baked as described in Example 4. The resist, as described in Example 5, may then be spin-coated on top of cross-linked PHS-DMS PFBUS polymeric PAG film and baked at about 110° C. for about 1 minute. The baked resist may then be exposed with a 100 kV Leica E-beam exposure tool. After exposure, the resist may be allowed to stand at room temperature for about 30 minutes before being developed with 0.263 N TMAH for about 60 seconds. The resulting resist profile on top of PHS-DMS PFBUS polymeric PAG film shows no foot.

While the present invention has been described in terms of exemplary embodiments, those skilled in the art will recognize that the invention can be practiced with modification within the spirit and scope of the appended claims.

Further, it is noted that Applicants' intent is to encompass equivalents of all claim elements, even if amended later during prosecution.

What is claimed is:

1. A lithographic structure, comprising:
    a polymeric photoacid generator layer formed on a substrate, said polymeric photoacid generator layer having a thickness of less than 200 Å and comprising:
        a polymeric backbone selected from group consisting of polyolefins, polyolefinsulfones, polyketones, polyethers, polysiloxanes, polysilsesquioxanes, polysilanes, polycarbosilanes, and any combination of these; and
        a pendant-sensitive acid-generating moiety attached to the polymeric backbone; and
    a resist layer formed on said polymeric photoacid generator layer.

2. The lithographic patterned structure of claim 1, wherein said polymeric photoacid generator layer comprises a polymeric photoacid generator which is selected from a group consisting of a polymer comprising at least one acid-generating moiety and a copolymer comprising at least one acid-generating moiety.

3. The lithographic structure of claim 1, wherein said substrate comprises a mask material.

4. The lithographic structure of claim 2, wherein said acid-generating moiety is selected from a group consisting of nitrobenzyl compounds, iodonium salts, sulfonium salts, sulfonates, carboxylates, and a combination of any of these.

5. The patterned structure for lithography of claim 1, further comprising an anti-reflective coating comprising an oxide layer formed between said polymeric photoacid generator layer and said substrate.

6. The patterned structure for lithography of claim 1, wherein said substrate comprises a chrome layer.

7. A method of patterning a substrate, comprising:
    forming a polymeric photoacid generator layer on a substrates, said polymeric photoacid generator layer having a thickness of less then 200 Å and comprising:
        a polymeric backbone selected from a group consisting of polyolefins, polyoleflosulfones, polyketones, polyethers, polysiloxanes, polysilsesquioxanes, polysilanes. polycarbosilanes, and any combination of these; and
        a pendant-sensitive acid-generating moiety attached to the polymer backbone; and forming a resist layer on said polymeric photoacid generator barrier layer;
    irradiating said resist layer and said polymeric photoacid generator layer and removing an irradiated portion or a non-irradiated portion of said resist and polymeric photoacid generator layers to form a pattern in said resist layer and said polymeric photoacid generator barrier layer; and
    transferring said pattern in said resist and polymeric photoacid generator layers to said substrate by etching said substrate to develop a pattern in said substrate.

8. The method of claim 7, wherein said polymeric photoacid generator layer comprises a polymeric photoacid generator which is selected from a group consisting of a polymer comprising at least one acid-generating moiety and a copolymer comprising at least one acid-generating moiety.

9. The method of claim 7, wherein said substrate comprises a mask material.

10. The method of claim 8, wherein said acid-generating moiety is selected from a group consisting of nitrobenzyl compounds, iodonium salts, sulfonium salts, sulfonates, carboxylates, and any combination of these.

11. The method of claim 9, wherein said polymeric backbone comprises polyethylene.

12. The method of claim 7, wherein said polymeric photoacid generator layer further comprises a crosslinker which crosslinks said polymeric backbone.

13. The method of claim 7, wherein said resist layer is selected from a group consisting of a positive tone chemically amplified resist and a negative tone chemically amplified resist.

14. The method of claim 7, wherein said substrate is selected from a group consisting of a glass plate, plastic plate, quartz plate, a mask membrane, a semiconductor wafer and any combination of these.

15. The method of claim 7, wherein said substrate comprises at least one material layer comprising a material which is selected from a group consisting of semiconductors, conductors, ceramics, organic dielectrics, and any combination of these.

16. The method of claim 15, wherein said substrate further comprises a material layer coating comprising at least one member selected from a group consisting of TiN, SiN, SiON, $Cr_xO_y$, and any combination of these.

17. The method of claim 7, further comprising:
fanning an anti-reflective coating on said substrate, said polymeric photoacid generator layer being formed on said anti-reflective coating.

18. A method of forming a patterned material feature on a substrate, the method comprising:
forming a polymeric photoacid generator layer on a material layer, said polymeric photoacid generator, said polymeric photoacid generator layer having a thickness of less than 200 Å and comprising:
a polymeric backbone selected from a group consisting of polyolefins, polyolefinsulfones, polyketones, polyethers, polysiloxanes, polysilsesquioxanes, polysilanes, polycarbosilanes, and any combination of these; and
a pendant-sensitive acid-generating moiety attached to the polymeric backbone;
forming a radiation-sensitive imaging layer on the polymeric photoacid generator layer, and patternwise exposing the imaging layer to radiation, thereby creating a pattern of radiation-exposed regions in the imaging layer and the polymeric photoacid generator layer;
selectively patterning of the imaging layer and the polymeric photoacid generator layer to expose said portion of the material layer; and
processing the exposed portion of the material layer, thereby forming the patterned material feature in said material layer.

19. The method of claim 18, wherein said processing said exposed portion comprises at least one member selected from a group consisting of etching, electroplating, metal depositing and ion implanting said exposed portion.

20. The method of claim 18, wherein said polymeric photoacid generator layer comprises a polymeric photoacid generator which is selected from a group consisting of a polymer comprising at least one acid-generating moiety and a copolymer comprising at least one acid-generating moiety.

21. The method of claim 18, wherein said an acid-generating moiety is selected from a group consisting of nitrobenzyl compounds, iodonium salts, sulfonium salts, sulfonates, carboxylates, and any combination of these.

22. The method of claim 18, wherein said radiation-sensitive imaging layer comprises a chemically amplified resist.

23. A lithographic structure, comprising:
a polymeric photoacid generator layer formed on a substrate, said polymeric photoacid layer having a thickness of less than 200 Å and comprising:
a polymeric photoacid generator comprising:
a polymeric backbone selected from a group consisting of polyolefins, polyolefinsulfones, polyketones, polyethers, polysiloxanes, polysilsesquioxanes, polysilanes, polycarbosilanes, and any combination of these; and
a pendant-sensitive acid-generating moiety attached to the polymeric backbone; and
a crosslinker which crosslinks said polymeric backbone; and
a resist layer formed on said polymeric photoacid generator layer,
wherein said substrate comprises at least one material layer comprising a material which is selected from a group consisting of semiconductors, conductors, ceramics, organic dielectrics, and any combination of these.

* * * * *

UNITED STATES PATENT AND TRADEMARK OFFICE
CERTIFICATE OF CORRECTION

PATENT NO. : 7,638,266 B2  Page 1 of 1
APPLICATION NO. : 10/916755
DATED : December 29, 2009
INVENTOR(S) : Angelopoulos et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 898 days.

Signed and Sealed this

Ninth Day of November, 2010

David J. Kappos
*Director of the United States Patent and Trademark Office*